US009685549B2

(12) United States Patent
Okita et al.

(10) Patent No.: US 9,685,549 B2
(45) Date of Patent: Jun. 20, 2017

(54) NITRIDE SEMICONDUCTOR DEVICE AND METHOD FOR MANUFACTURING SAME

(71) Applicant: PANASONIC CORPORATION, Osaka (JP)

(72) Inventors: Hideyuki Okita, Toyama (JP); Yasuhiro Uemoto, Toyama (JP); Masahiro Hikita, Toyama (JP); Hidenori Takeda, Mie (JP); Takahiro Sato, Toyama (JP); Akihiko Nishio, Ishikawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 35 days.

(21) Appl. No.: 14/104,710

(22) Filed: Dec. 12, 2013

(65) Prior Publication Data

US 2014/0097468 A1 Apr. 10, 2014

Related U.S. Application Data

(63) Continuation of application No. PCT/JP2012/004343, filed on Jul. 4, 2012.

(30) Foreign Application Priority Data

Jul. 12, 2011 (JP) .................................. 2011-153720

(51) Int. Cl.
*H01L 29/66* (2006.01)
*H01L 29/778* (2006.01)
(Continued)

(52) U.S. Cl.
CPC .... *H01L 29/7789* (2013.01); *H01L 29/42316* (2013.01); *H01L 29/66462* (2013.01);
(Continued)

(58) Field of Classification Search
CPC ............... H01L 29/778; H01L 29/7782; H01L 29/7787; H01L 29/66462; H01L 29/0688;
(Continued)

(56) References Cited

U.S. PATENT DOCUMENTS 8,441,035 B2 * 5/2013 Hikita .................. H01L 29/808
257/192
8,729,562 B2 * 5/2014 Okada ................. H01L 29/7786
257/13

(Continued)

FOREIGN PATENT DOCUMENTS

JP 07-183492 A 7/1995
JP 2006-286942 A 10/2006
(Continued)

OTHER PUBLICATIONS

International Search Report issued in International Application No. PCT/JP2012/004343 mailed Oct. 9, 2012, 4 pgs.

*Primary Examiner* — Cheung Lee
*Assistant Examiner* — Stephen C Smith
(74) *Attorney, Agent, or Firm* — McDermott Will & Emery LLP

(57) ABSTRACT

A nitride semiconductor device includes: a substrate; a first nitride semiconductor layer (1) located over the substrate; a second nitride semiconductor layer (2) located over the first nitride semiconductor layer (1), having a larger band gap than the first nitride semiconductor layer (1), and having a recess (11) penetrating into the first nitride semiconductor layer (1); and a third nitride semiconductor layer (12) continuously covering the second nitride semiconductor layer (2) and the recess (11), and having a larger band gap than the first nitride semiconductor layer (1); a gate electrode (5) located above a portion of the third nitride semiconductor layer (12) over the recess (11); and a first ohmic
(Continued)

electrode (4a) and a second ohmic electrode (4b) located on opposite sides of the gate electrode (5).

11 Claims, 14 Drawing Sheets

(51) Int. Cl.
    *H01L 29/423*     (2006.01)
    *H01L 29/06*     (2006.01)
    *H01L 29/10*     (2006.01)
    *H01L 29/20*     (2006.01)

(52) U.S. Cl.
    CPC .... *H01L 29/66469* (2013.01); *H01L 29/7787* (2013.01); *H01L 29/0688* (2013.01); *H01L 29/1066* (2013.01); *H01L 29/2003* (2013.01)

(58) Field of Classification Search
    CPC ............. H01L 29/1066; H01L 29/2003; H01L 29/7789; H01L 29/0661; H01L 29/0684; H01L 29/42316
    See application file for complete search history.

(56) References Cited

U.S. PATENT DOCUMENTS

| | | | |
|---|---|---|---|
| 2006/0220060 A1 | 10/2006 | Nakata et al. | |
| 2007/0045670 A1 | 3/2007 | Kuraguchi | |
| 2008/0128753 A1* | 6/2008 | Parikh ................ | H01L 29/7787 257/194 |
| 2009/0146182 A1 | 6/2009 | Hikita et al. | |
| 2009/0146185 A1* | 6/2009 | Suh .................... | H01L 29/2003 257/194 |
| 2010/0155780 A1 | 6/2010 | Machida et al. | |
| 2010/0159656 A1* | 6/2010 | Nakata et al. ................ | 438/268 |
| 2010/0210080 A1 | 8/2010 | Nomura et al. | |
| 2010/0244041 A1* | 9/2010 | Oishi .................. | H01L 29/0688 257/76 |
| 2011/0084713 A1* | 4/2011 | Ren et al. ...................... | 324/693 |
| 2011/0227093 A1* | 9/2011 | Hikita .................. | H01L 29/808 257/76 |
| 2011/0227132 A1 | 9/2011 | Anda et al. | |
| 2012/0061729 A1 | 3/2012 | Shibata et al. | |
| 2012/0139630 A1* | 6/2012 | Ozaki .............. | H01L 21/02057 330/250 |
| 2012/0181548 A1* | 7/2012 | Okada et al. .................. | 257/76 |
| 2014/0091316 A1* | 4/2014 | Kikkawa ........... | H01L 29/66462 257/76 |
| 2014/0138747 A1* | 5/2014 | Lee .................... | H01L 29/42316 257/194 |

FOREIGN PATENT DOCUMENTS

| | | |
|---|---|---|
| JP | 2007-067240 A | 3/2007 |
| JP | 2008-210836 A | 9/2008 |
| JP | 2008-235347 A | 10/2008 |
| JP | 2009-141244 A | 6/2009 |
| JP | 2010-135640 A | 6/2010 |
| JP | 2010-147387 A | 7/2010 |
| JP | 2010-192633 A | 9/2010 |
| JP | 2011-029247 A | 2/2011 |
| JP | 2011-124509 A | 6/2011 |

* cited by examiner

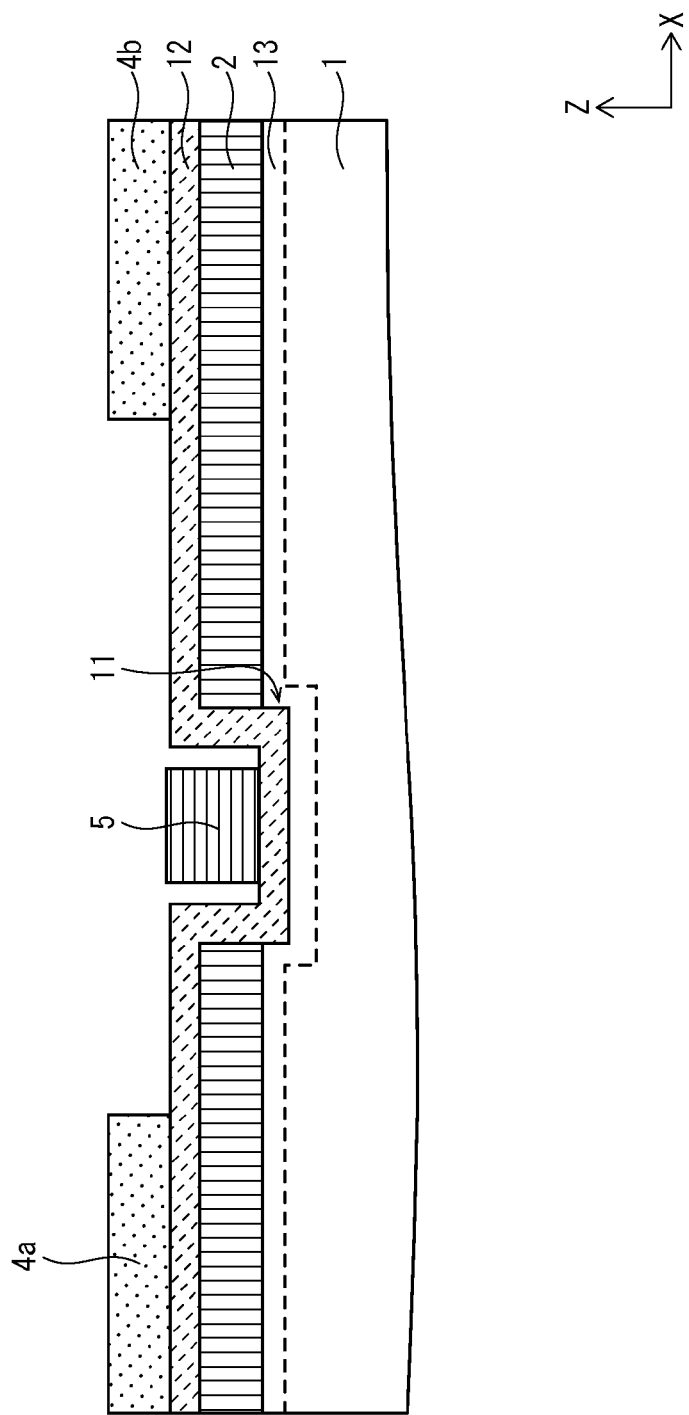

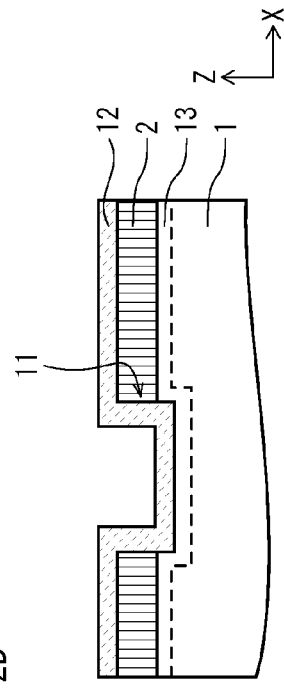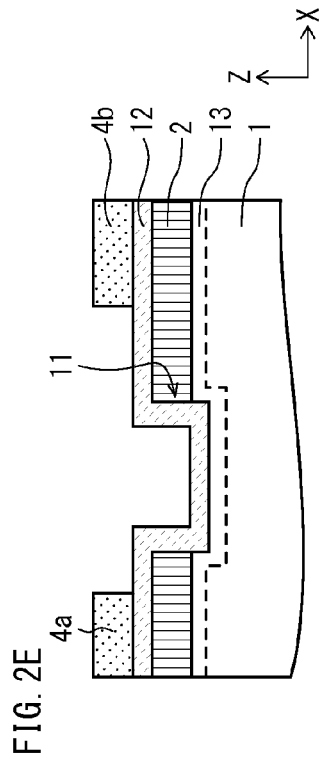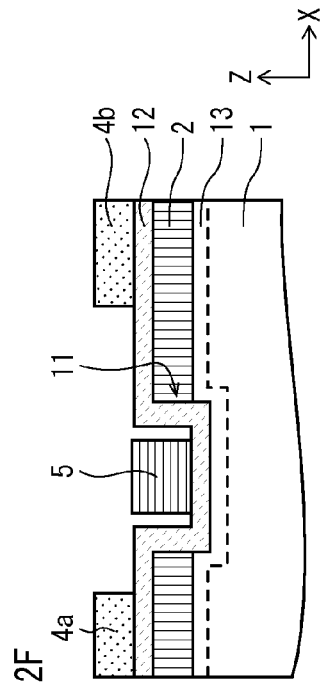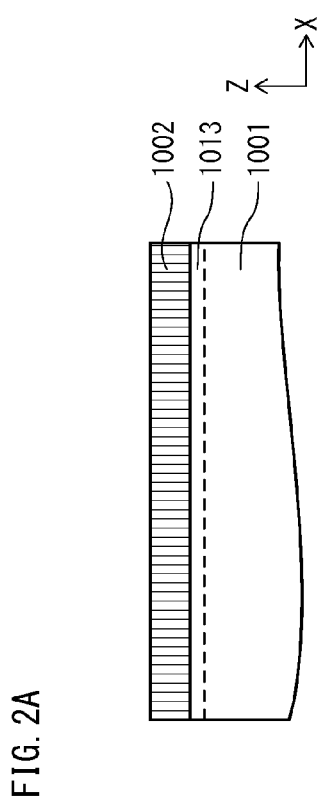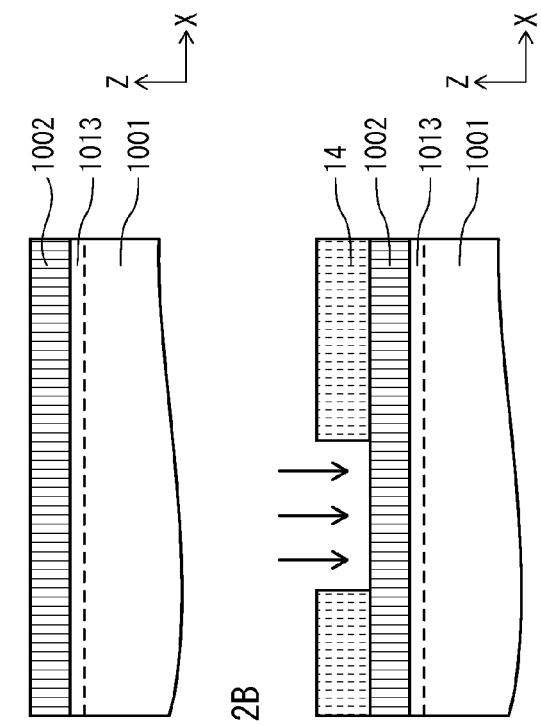

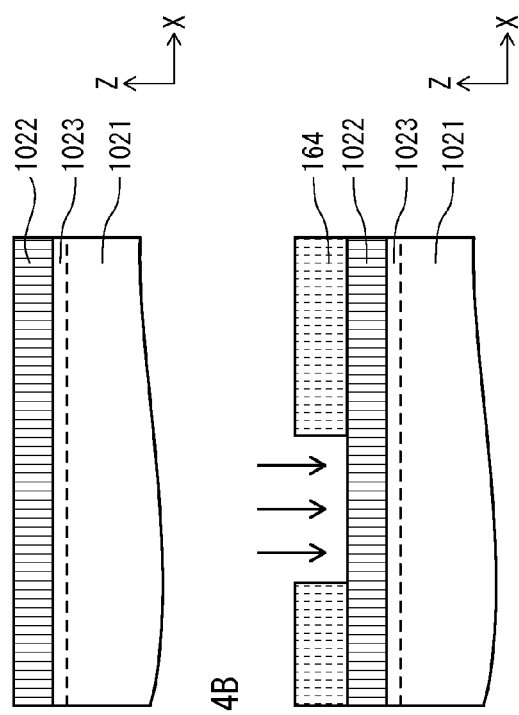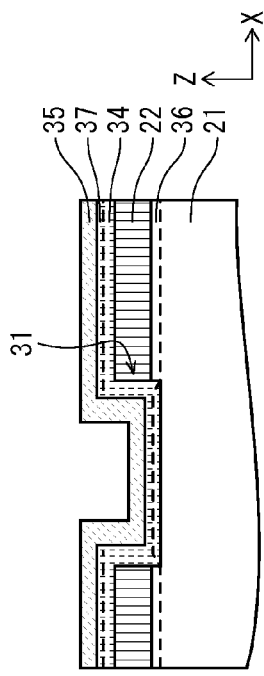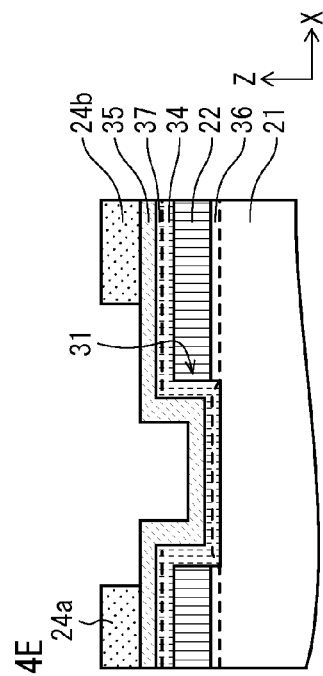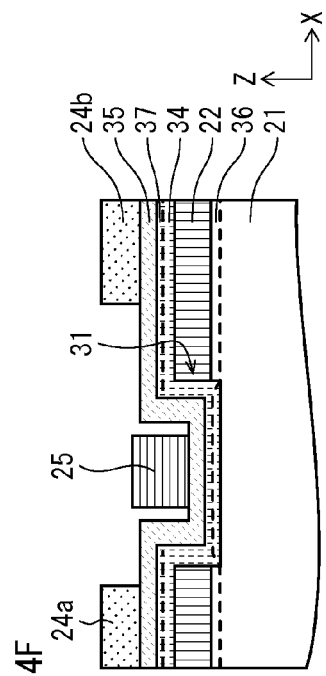

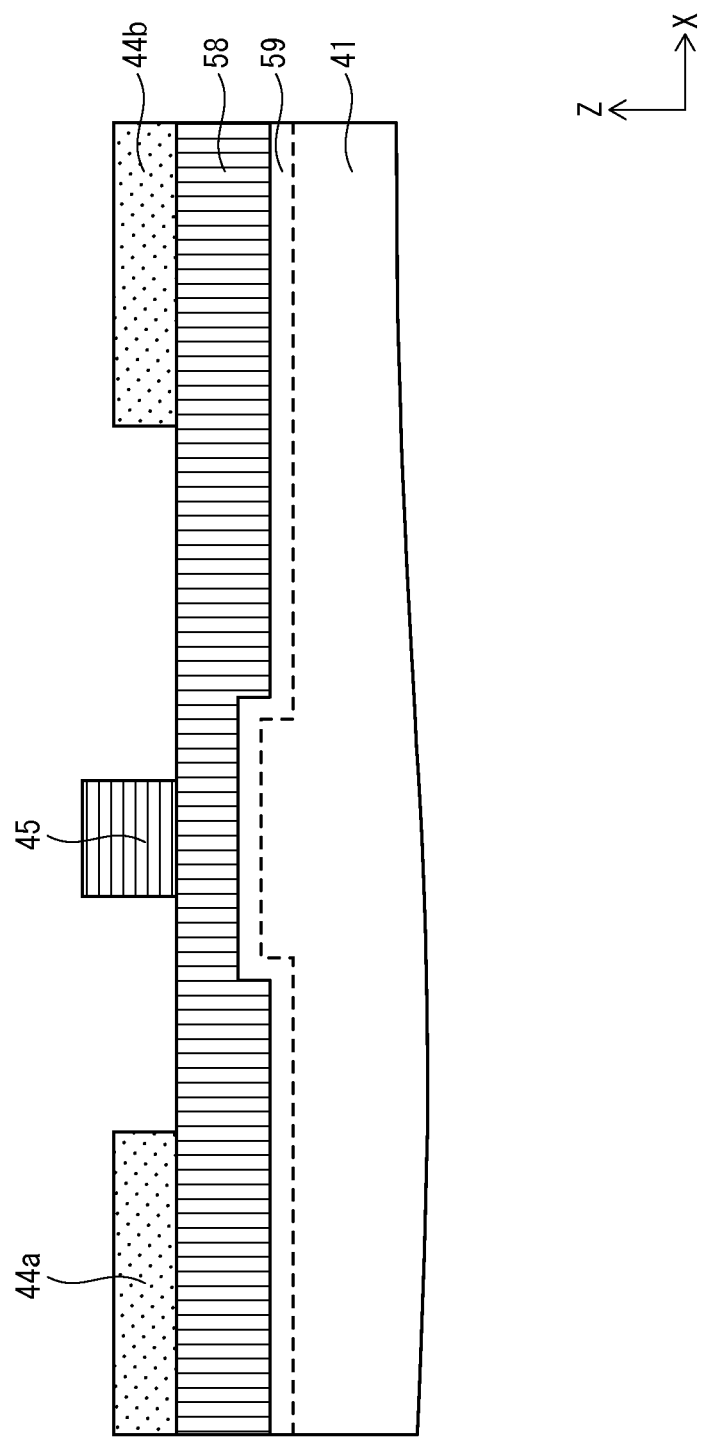

US 9,685,549 B2

NITRIDE SEMICONDUCTOR DEVICE AND METHOD FOR MANUFACTURING SAME

CROSS REFERENCE TO RELATED APPLICATION

This is a continuation application of PCT Application No. PCT/JP2012/004343 filed Jul. 4, 2012, designating the United States of America, and claims the benefit of Japanese Application No. 2011-153720, filed Jul. 12, 2011, the disclosures of which, including the specification, drawings and claims, are incorporated herein by reference in their entirety.

TECHNICAL FIELD

The present disclosure relates to a nitride semiconductor device and a method for manufacturing the same, and, in particular, to a nitride semiconductor device including a group III nitride semiconductor, which can be used as a power transistor, and a method for manufacturing the same.

BACKGROUND ART

The group III nitride semiconductors, particularly GaN and AlGaN have a high dielectric breakdown voltage because of their wide band gaps. Furthermore, formation of heterostructures, such as an AlGaN/GaN structure, is easy. Piezoelectric charges generated by the difference in lattice constant between AlGaN and GaN as well as the difference in band gap cause high concentration of an electronic channel (a two dimensional electron gas (2DEG)) on a GaN layer-side of an interface between AlGaN and GaN, thereby enabling high-current and high-speed operation. Expectations for application of the group III nitride semiconductors to electron devices such as power field-effect transistors (FETs) and diodes have thus risen in recent years.

Because of its capability of performing high-current operation, a typical planar heterojunction FET (HFET) having the AlGaN/GaN structure, for example, an HFET with an Al composition of 25% and a thickness of 20 nm, might be normally on and have a negative threshold voltage.

From the standpoint of safety, however, it is highly desirable that a typical circuit including a power FET be normally off and have a positive threshold voltage.

FIG. 13A shows one example of a cross section of an AlGaN/GaN-HFET having the simplest structure. The group III nitride semiconductor (e.g. GaN) is formed, as a channel layer 901, over an appropriate substrate (a substrate made for example of SiC, Sapphire, Si, and GaN), a buffer layer (a buffer layer made of a combination of group III nitride semiconductors, particularly AlN, AlGaN, and GaN), or the like. A carrier supply layer 902 (e.g. AlGaN) having a larger band gap than the channel layer 901 is epitaxially grown. A 2DEG 903 is generated on a channel layer-side of an interface between the channel layer 901 and the carrier supply layer 902. A source electrode 904a and a drain electrode 904b that form ohmic contacts are then formed on the carrier supply layer 902. On a portion of the carrier supply layer 902 between these electrodes, a gate electrode 905 that forms a Schottky contact is formed. The source electrode 904a and the drain electrode 904b are each made of a combination of one or more types of metal such as Ti, Al, Mo, and Hf. The gate electrode 905 is made of a combination of one or more types of metal such as Ni, Pt, Pd, and Au.

Several reports have shown methods for achieving normally-off operation using the group III nitride semiconductors.

The most common method (Method 1) is a method of epitaxially growing the carrier supply layer 902 below the gate electrode 905 of the AlGaN/GaN-HFET structure so that the carrier supply layer 902 has a thickness of no more than several nanometers.

A method (Method 2) disclosed in paragraph [0016] of Patent Literature 1, which is a prior art reference, is as follows. Method 2 is shown in FIG. 13B. A portion of a carrier supply layer 912 under a gate electrode 915 of the AlGaN/GaN-HFET structure, which is similar to that shown in FIG. 13A, is etched by using a known technique so as to define a recess. This structure is typically called a recessed structure 916. By reducing the thickness of the portion of the carrier supply layer 912 under the gate, the threshold voltage is shifted in a positive direction. In order to achieve the normally-off operation with the typical AlGaN/GaN structure, a portion of an AlGaN layer under the gate electrode 915 is required to be etched so as to have a thickness of several nanometers.

FIG. 13C shows a method (Method 3) disclosed in Patent Literature 1. A carrier supply layer 922 having the recessed gate structure, which is similar to that shown in FIG. 13B, is divided into three parts when being epitaxially grown, and an etching stopper layer 927 made for example of GaN and a second carrier supply layer 928 made for example of AlGaN are sequentially formed on the carrier supply layer 922 made for example of AlGaN, over a 2DEG-side of an interface. In this case, it is desirable to use, as the etching stopper layer 927, a group III nitride semiconductor (e.g. GaN) that is easily depleted with a low voltage. This is because control over the threshold voltage is facilitated by stopping etching in the middle of the etching stopper layer 927.

FIG. 14A shows a method (Method 4) disclosed in Patent Literature 2. In Method 4, a carrier supply layer 932 below a gate electrode 935, which determines the threshold voltage, is epitaxially grown so as to have a thickness of several nanometers so that the normally-off operation can be achieved. A second carrier supply layer 939 is then grown, by using a known regrowth technique, over a portion of the carrier supply layer 932 other than a portion of the carrier supply layer 932 on which the gate electrode 935 is to be formed. With this method, a structure similar to the recessed gate structure can be made.

FIG. 14B shows a method (Method 5) disclosed in Patent Literature 3. As in Method 2, after formation of a recessed structure 946, a cap layer 950 made of a p-type group III nitride semiconductor (e.g. p-AlGaN) is formed only at and around the recessed structure 946. A source electrode 944a and a drain electrode 944b that form ohmic contacts are then formed. On the cap layer 950 between these electrodes, a gate electrode 945 that forms an ohmic contact is formed. Method 5 is different from the other four methods in that a p-type semiconductor is interposed between the gate electrode 945 and the carrier supply layer 942. The carrier supply layer 942 is typically of n-type when being made of a group III nitride semiconductor. Thus, a depletion layer is naturally formed between the cap layer 950, which is of p-type, and the carrier supply layer 942, and a 2DEG is depleted in a state where no voltage is applied. A portion of the carrier supply layer 942 under the gate is thus made to have a greater thickness to achieve normally-off operation.

CITATION LIST

Patent Literature

[Patent Literature 1]
Japanese Patent Application Publication No. 2007-67240
[Patent Literature 2]
Japanese Patent Application Publication No. 2008-235347
[Patent Literature 3]
Japanese Patent Application Publication No. 2011-29247

SUMMARY OF INVENTION

Technical Problem

The conventional techniques described in Background Art, however, have problems in manufacturing HFETs that are normally off and include the group III nitride semiconductors.

Firstly, in Method 1, the 2DEG 903 is hardly generated as the carrier supply layer 902 is made ultrathin, and thus a drain-to-source current (Ids) hardly flows through the FET. In addition, the barrier height of the carrier supply layer 902 is low, and thus a large amount of a gate leakage current flows. Furthermore, since a surface of the carrier supply layer 902 is in close contact with the 2DEG 903, electrons are trapped at a surface level normally existing on the surface of the group III nitride semiconductor, and thus current collapse, which can block current, easily occurs. In view of the foregoing, it is almost impossible to perform operation as the FET in Method 1.

Secondly, in Method 2, since a portion of the carrier supply layer other than the portion of the carrier supply layer under the gate is thick, a small amount of current and current collapse as observed in Method 1 are less likely to occur.

Method 2, however, has extreme difficulty in controlling etching depth, because it is necessary to perform etching so that a portion of the carrier supply layer 912 under the gate electrode 915 has a thickness of several nanometers to achieve normally-off operation. Since a remaining AlGaN layer is made ultrathin, a forward voltage (corresponding to a voltage when Igs is 1 μm/mm, for example, although various definitions are possible) $V_f$ applied to the gate is extremely low, specifically not more than 1 V. Even if normally-off operation is achieved, an actual Ids is extremely small, interfering with the operation of the FET.

As in Method 1, the barrier height of the carrier supply layer 912 is low, and thus a large amount of the gate leakage current flows. Furthermore, since the threshold voltage $V_{th}$ depends on two in-plane distributions, that is, in-plane distributions of the epitaxial growth and the etching, it is also extremely difficult to control these in-plane distributions.

Thirdly, in Method 3, since a portion of the carrier supply layer other than a portion of the carrier supply layer under the gate is thick, current collapse is less likely to occur. Compared to Methods 1 and 2, the controllability of the threshold voltage $V_{th}$ greatly improves due to the presence of the etching stopper layer 927, but there is a limit as the etching is performed by controlling time. The forward voltage $V_f$ is secured to some extent, for example, by using undoped GaN as the etching stopper layer 927. The forward voltage $V_f$, however, is 3 V at most. As in Methods 1 and 2, the barrier height is low, and thus a large amount of the gate leakage current flows. Compared to Methods 1 and 2, the in-plane distribution of the threshold voltage $V_{th}$ improves, but the in-plane distribution of the forward voltage $V_f$ deteriorates because the thickness of the etching stopper layer 927 eventually varies.

Fourthly, Method 4 has substantially the same structure as Method 2, and thus is poor in terms of the gate leakage current and the low forward voltage $V_f$.

Method 4, however, has the most desirable in-plane distribution of the threshold voltage $V_{th}$, as it depends only on the in-plane distribution of the epitaxial growth.

Fifthly, in Method 5, a forward voltage $V_f$ of up to 5 V can be secured by forming the p-type cap layer 950. Method 5 is the most suitable method for causing the FET to be normally off, as the gate leakage current can also be kept low.

One problem that Method 5 might have is the in-plane distribution of the threshold voltage $V_{th}$. The control over the threshold voltage $V_{th}$ is not so severe as Methods 1 and 2, because etching is performed so that a portion of the layer having a thickness for natural depletion remains. Although not so difficult as Method 2 (because the thickness of the remaining portion of the layer is greater), the control over the in-plane distribution of the threshold voltage $V_{th}$ is difficult because it depends on two in-plane distributions, that is, the in-plane distributions of the epitaxial growth and the etching.

As described above, in the conventional techniques, a device that excels in all of the controllability and the in-plane distributions of the forward voltage $V_f$ and the threshold voltage $V_{th}$, the gate leakage current, and the normally-off operation cannot be manufactured. The following Table 1 shows results of evaluation of characteristics of HFETs manufactured by using the above-mentioned conventional techniques. In Table 1, a circle "○", a triangle "Δ", and a cross "x" respectively indicate "good", "not good", and "poor".

TABLE 1

|  | Method 1 | Method 2 | Method 3 | Method 4 | Method 5 |
|---|---|---|---|---|---|
| $V_f$ | up to 1 V | up to 1 V | up to 3 V | up to 1 V | up to 5 V |
| In-plane distribution of $V_f$ | Δ | Δ | X | Δ | ○ |
| Controllability of $V_{th}$ | X | X | Δ | ○ | Δ |
| In-plane distribution of $V_{th}$ | X | X | Δ | ○ | Δ |
| Gate leakage current | X | X | Δ | X | ○ |
| Normally-off operation | X | X | Δ | X | ○ |

The present disclosure has been conceived in view of the above-mentioned problems, and an aim thereof is to provide a nitride semiconductor device that excels in the in-plane distribution and the controllability of the threshold voltage of a group III nitride semiconductor for achieving normally-off operation, and a method for manufacturing the nitride semiconductor device.

Solution to Problem

The nitride semiconductor device pertaining to one aspect of the present invention is a nitride semiconductor device including: a substrate; a semiconductor layer stack that is located over the substrate, and includes a first nitride semiconductor layer having a recess, a second nitride semiconductor layer located over a portion of the first nitride semiconductor layer other than the recess, and having a larger band gap than the first nitride semiconductor layer, and a third nitride semiconductor layer continuously covering the second nitride semiconductor layer and the recess of the first nitride semiconductor layer, and having a larger band gap than the first nitride semiconductor layer; a gate electrode that is located above a portion of the third nitride semiconductor layer over the recess; and a first ohmic electrode and a second ohmic electrode that are located on opposite sides of the gate electrode.

The method for manufacturing the nitride semiconductor device pertaining to another aspect of the present invention is a method including: preparing a substrate; forming a first nitride semiconductor layer over the substrate; stacking a second nitride semiconductor layer over the first nitride semiconductor layer, the second nitride semiconductor layer having a larger band gap than the first nitride semiconductor layer; providing a recess penetrating through the second nitride semiconductor layer into the first nitride semiconductor layer; stacking a third nitride semiconductor layer that continuously covers the second nitride semiconductor layer and the recess, the third nitride semiconductor layer having a larger band gap than the first nitride semiconductor layer; forming a first ohmic electrode and a second ohmic electrode on opposite sides of the recess; and forming a gate electrode on a portion of the third nitride semiconductor layer over the recess.

The method for manufacturing the nitride semiconductor device pertaining to yet another aspect of the present invention is a method including: preparing a substrate; forming a first nitride semiconductor layer over the substrate; stacking a second nitride semiconductor layer over the first nitride semiconductor layer, the second nitride semiconductor layer having a larger band gap than the first nitride semiconductor layer; providing a recess penetrating through the second nitride semiconductor layer into the first nitride semiconductor layer; stacking a third nitride semiconductor layer that continuously covers the second nitride semiconductor layer and the recess, the third nitride semiconductor layer having a larger band gap than the first nitride semiconductor layer; forming a p-type nitride semiconductor layer over the third nitride semiconductor layer so that the recess is covered; selectively removing the p-type nitride semiconductor layer so that a portion other than a portion of the p-type nitride semiconductor layer over the recess is removed; forming a first ohmic electrode and a second ohmic electrode on opposite sides of a remaining portion of the p-type nitride semiconductor layer; and forming a gate electrode on the remaining portion of the p-type nitride semiconductor layer.

Advantageous Effects of Invention

According to the nitride semiconductor device pertaining to one aspect of the present invention having the above-mentioned structure, the forward voltage $V_f$ and the threshold voltage $V_{th}$ are almost exclusively controlled by the third nitride semiconductor layer. Since the in-plane distributions of the forward voltage $V_f$ and the threshold voltage $V_{th}$ of the nitride semiconductor device pertaining to one aspect of the present invention depend almost exclusively on a growth rate and an in-plane distribution of the third nitride semiconductor layer, the in-plane distribution greatly improves compared to the conventional techniques.

The nitride semiconductor device pertaining to one aspect of the present invention excels in the in-plane distribution and the controllability of the threshold voltage of the group III nitride semiconductor for achieving the normally-off operation.

By the method for manufacturing the nitride semiconductor device pertaining to another aspect of the present invention, the nitride semiconductor device pertaining to one aspect of the present invention and having the above-mentioned structure can be manufactured. Thus, by the method for manufacturing the nitride semiconductor device pertaining to another aspect of the present invention, the nitride semiconductor device that excels in the in-plane distribution and the controllability of the threshold voltage of the group III nitride semiconductor for achieving the normally-off operation can be manufactured.

BRIEF DESCRIPTION OF DRAWINGS

FIG. 1 is a schematic sectional view showing an example of the structure of a recessed group III nitride semiconductor HFET having a recess at an interface between a carrier supply layer and a channel layer, pertaining to Embodiment 1 of the present invention.

FIGS. 2A through 2F are schematic sectional views showing the structures in steps of manufacturing the recessed group III nitride semiconductor HFET having the recess at the interface between the carrier supply layer and the channel layer.

FIGS. 4A through 4F are schematic sectional views showing the structures in steps of manufacturing the recessed group III nitride semiconductor HFET having the recess at the interface between the carrier supply layer and the channel layer.

FIG. 5 is a schematic sectional view showing an example of the structure of a group III nitride semiconductor HFET having a projection at an interface between a carrier supply layer and a channel layer, pertaining to Embodiment 2 of the present disclosure.

DESCRIPTION OF EMBODIMENTS

Embodiment 1

Figure 3:
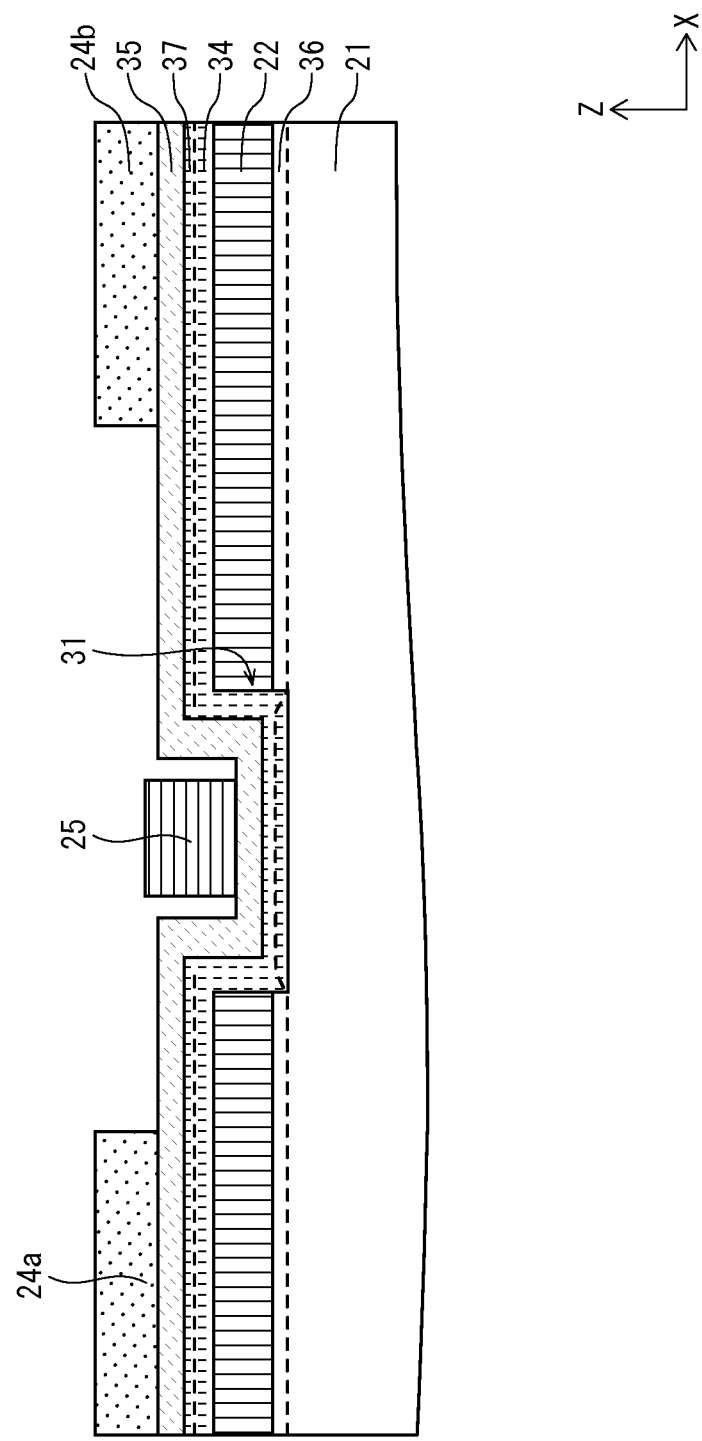
FIG. 3 is a schematic sectional view showing another example of the structure of the recessed group III nitride semiconductor HFET having the recess at the interface between the carrier supply layer and the channel layer.

FIG. 1 shows the structure of a recessed compound semiconductor HFET having a recess at an interface between a carrier supply layer and a channel layer in Embodiment 1 of the present invention. Although a group III nitride semiconductor is used in the present embodiment, the present invention is in no way limited.

The structure of the recessed compound semiconductor HFET is as follows: a channel layer 1 (a channel layer made for example of a group III nitride semiconductor such as GaN, InGaN, and InAlGaN) is formed over an appropriate substrate (a substrate made for example of SiC, Sapphire, Si, and GaN, not illustrated), a buffer layer (a buffer layer made for example of a combination of a plurality of group III nitride semiconductors such as AlN, AlGaN, GaN, and InGaN, not illustrated), or the like. A carrier supply layer 2 including a semiconductor (a group III nitride semiconductor such as AlGaN and InAlGaN) having a wider band gap than the channel layer 1 is stacked over the channel layer 1. A recess 11 is formed so as to penetrate through the carrier supply layer 2 into the channel layer 1. A second carrier supply layer 12 including a group III nitride semiconductor (a group III nitride semiconductor such as AlGaN and InAlGaN) having a wider band gap than the channel layer 1 is formed so as to continuously cover the carrier supply layer 2 and the recess.

A gate electrode 5 forms a Schottky contact with a part of the recess of the epi-structure. A source electrode 4a and a drain electrode 4b form ohmic contacts with portions of the second carrier supply layer 12 located on left and right sides of the gate electrode 5, respectively. As long as the source electrode 4a and the drain electrode 4b are respectively located on the left and right sides of the gate electrode 5, these electrodes may not be located above the carrier supply layer 2 as shown in FIG. 1. For example, these electrodes may have a recessed ohmic structure (an ohmic electrode structure manufactured by digging the carrier supply layer) in which these electrodes are formed to be in contact with both the carrier supply layer 2 and the channel layer 1. As long as the gate electrode 5 is partially in contact with the recess 11, the gate electrode 5 may be formed so as to bury the periphery of the recess 11.

In the recessed compound semiconductor HFET pertaining to the present embodiment, the channel layer 1, the carrier supply layer 2, and the second carrier supply layer 12 constitute a semiconductor layer stack. In each of the following embodiments, a stack of a first nitride semiconductor layer, a second nitride semiconductor layer, and a third nitride semiconductor layer corresponds to the semiconductor layer stack. The second nitride semiconductor layer has a larger band gap than the first nitride semiconductor layer, and has a recess extending to the first nitride semiconductor layer. The third nitride semiconductor layer has a larger band gap than the first nitride semiconductor layer and continuously covers the second nitride semiconductor layer and the recess.

FIGS. 2A through 2F show a method for manufacturing the recessed compound semiconductor HFET in the present embodiment. Although a manufacturing method using a group III nitride semiconductor is described in the present embodiment, the present invention is in no way limited. FIGS. 2A through 2F show a minimum structure for achieving one aspect of the present invention, and the manufacturing method is in no way limited.

At first, a buffer layer (a buffer layer made for example of a combination of a plurality of group III nitride semiconductors such as AlN, AlGaN, GaN, and InGaN, not illustrated) is grown over a substrate (not illustrated) for group III nitride semiconductor epitaxial growth made for example of Sapphire, SiC, Si, and GaN by using a known epitaxial growth method (e.g. metal organic chemical vapor deposition (MOCVD)) as appropriate. A channel layer 1001 (e.g. GaN and InGaN) including a group III nitride semiconductor is then grown, and, subsequently, a carrier supply layer 1002 (e.g. AlGaN and AlInGaN) including a group III nitride semiconductor having a wider band cap than the channel layer 1001 is grown (FIG. 2A).

The substrate thus obtained is referred to as an epitaxial growth substrate. A resist pattern 14 is formed, by using known photolithography or a similar method, on a portion of the epitaxial growth substrate other than a portion of the epitaxial growth substrate on which a gate electrode is to be formed (FIG. 2B). The recess 11 is then formed by using known dry etching (e.g. reactive ion etching (RIE) and inductively coupled plasma reactive ion etching (ICP-RIE)) using chlorine gas and boron chloride gas or a similar method. In this case, the recess 11 is required to penetrate through the carrier supply layer 1002 into the channel layer 1001 at any point in a plane of a wafer.

From the standpoint of a depth margin, it is desirable that a bottom of the recess 11 penetrating the carrier supply layer 1002 be lower by at least 0.5 nm than a bottom face of the carrier supply layer 1002. The resist pattern 14 is then thoroughly purified by using organic detergent, and the like (FIG. 2C). The second carrier supply layer 12 is then grown so as to cover the recess 11 by using the known epitaxial growth method (FIG. 2D).

The second carrier supply layer 12 is required to be made of a group III nitride semiconductor (e.g. AlGaN and AlInGaN) having a wider band gap than the channel layer 1. When the second carrier supply layer 12 is an AlGaN layer having an Al composition of 25%, the second carrier supply layer 12 is required to have a thickness not more than several nanometers (not more than 4 to 5 nm) to achieve the normally-off operation.

Electrodes (e.g. electrodes made of a combination of one or more layers of Ti, Al, Mo, and Hf) that form ohmic contacts with the second carrier supply layer 12 are then formed on respective sides of the recess 11 by using known photolithography, deposition, lift-off, annealing, and the like. The source electrode 4a and the drain electrode 4b are herein respectively formed on the left side and the right side of the recess 11 (FIG. 2E). As long as these ohmic electrodes are on the left and right sides of the recess 11, these ohmic electrodes may be in contact with a group III nitride semiconductor of any of the second carrier supply layer 12, the carrier supply layer 2, and the channel layer 1 (may have a so-called recessed ohmic structure).

Similarly, by using the known photolithography, deposition, lift-off, annealing, and the like, the gate electrode 5 (e.g. an electrode made of a combination of one or more layers of Ni, Pt, Pd, and Au) that forms a Schottky contact with the group III nitride semiconductor is then formed (FIG. 2F), and the processing is completed.

As long as the gate electrode 5 is partially in contact with the recess 11, the gate electrode 5 may be formed so as to bury the periphery of the recess 11.

The second carrier supply layer 12 as described above is not limited to a single layer. For example, the second carrier supply layer 12 may have a heterostructure such as an AlGaN/GaN structure (not illustrated) including an AlGaN layer and a GaN layer stacked in that order, and a GaN/AlGaN structure (FIG. 1) including the GaN layer and the AlGaN layer stacked in that order. When the second carrier supply layer 12 has a two-layer structure, and a group III nitride semiconductor in a lower layer (channel-side layer) has a larger band gap than that in an upper layer, the nitride semiconductor device can be manufactured in the same method as that shown in FIGS. 2A through 2F.

FIG. 3 shows a case where the second carrier supply layer 12 has the two-layer structure, and the group III nitride semiconductor in the lower layer (channel-side layer) has a smaller band gap than that in the upper layer.

The structure shown in FIG. 3 is as follows: a channel layer 21 (a channel layer made for example of a group III nitride semiconductor such as GaN, InGaN, and InAlGaN) is formed over an appropriate substrate (a substrate made for example of SiC, Sapphire, Si, and GaN, not illustrated), a buffer layer (a buffer layer made for example of a combination of a plurality of group III nitride semiconductors such as AlN, AlGaN, GaN, and InGaN, not illustrated), or the like. A carrier supply layer 22 including a semiconductor (a group III nitride semiconductor such as AlGaN and InAlGaN) having a wider band gap than the channel layer 21 is stacked over the channel layer 21. A recess 31 is formed to penetrate through the carrier supply layer 22 into the channel layer 21. A second channel layer 34 including a semiconductor (a group III nitride semiconductor such as GaN and InGaN) having a band gap equal to or wider than the channel layer 21 and a second carrier supply layer 35 (a group III nitride semiconductor such as AlGaN and AlInGaN) are further formed so as to continuously cover the carrier supply layer 22 and the recess. A gate electrode 25 forms a Schottky contact with a part or all of the recess of the epi-structure. A source electrode 24a and a drain electrode 24b form ohmic contacts with portions of the second carrier supply layer 35 located on left and right sides of the gate electrode 25, respectively.

A second 2DEG 37 is formed between the second channel layer 34 and the second carrier supply layer 35. By being combined with the existing 2DEG 13, a 2DEG 36 projecting upwards at and around the recess 31 is formed.

FIGS. 4A through 4F show a method for manufacturing a nitride semiconductor device having the above-mentioned structure. Processing performed in steps shown in FIGS. 4A through 4C is the same as that performed in the steps shown in FIGS. 2A through 2C. Description thereof is thus omitted.

Following the processing performed in the step shown in FIG. 4C, the second channel layer 34 (e.g. GaN and InGaN) and the second carrier supply layer 35 (e.g. AlGaN and AlInGaN) are sequentially regrown by using the known epitaxial growth method so as to cover the recess 31 (FIG. 4 D). The second carrier supply layer 35 is required to have a larger band gap than the second channel layer 34. By the second carrier supply layer 35 having a larger band gap than the second channel layer 34, the second 2DEG 37 is formed on a channel layer 34-side of an interface between the second carrier supply layer 35 and the second channel layer 34. At and around the recess 31, the second 2DEG 37 is combined with the existing 2DEG 13 and projects upwards. When the second carrier supply layer 35 is an AlGaN layer having an Al composition of 25%, the second carrier supply layer 35 is required to have a thickness not more than several nanometers (not more than 4 to 5 nm) to achieve the normally-off operation.

Electrodes (e.g. electrodes made of a combination of one or more layers of Ti, Al, Mo, and Hf) that form ohmic contacts with the second carrier supply layer 35 are then formed on respective sides of the recess 31 by using known photolithography, deposition, lift-off, annealing, and the like. The source electrode 24a and the drain electrode 24b are herein respectively formed on the left side and the right side of the recess 31 (FIG. 4E).

As long as these ohmic electrodes are on the left and right sides of the recess 31, these ohmic electrodes may be in contact with a group III nitride semiconductor of any of the second carrier supply layer 35, the carrier supply layer 22, and the channel layer 21 (may have a so-called recessed ohmic structure).

Similarly, by using the known photolithography, deposition, lift-off, annealing, and the like, the gate electrode 25 (e.g. an electrode made of a combination of one or more layers of Ni, Pt, Pd, and Au) that forms a Schottky contact with the group III nitride semiconductor is then formed (FIG. 4F), and the processing is completed. As long as the gate electrode 25 is partially in contact with the recess 31, the gate electrode 25 may be formed so as to bury the periphery of the recess 31.

With the above-mentioned structure, the forward voltage $V_f$ and the threshold voltage $V_{th}$ are controlled almost exclusively by the second carrier supply layer 35. The in-plane distributions of the forward voltage $V_f$ and the threshold voltage $V_{th}$ thus depend almost exclusively on the growth rate and the in-plane distribution of the second carrier supply layer 35, and the in-plane distribution greatly improves.

Embodiment 2

FIG. 5 shows the structure of a recessed group III nitride semiconductor HFET having a projection at an interface between a carrier supply layer and a channel layer in Embodiment 2 of the present disclosure. Although a group III nitride semiconductor is used in the present embodiment, the present invention is in no way limited.

The structure shown in FIG. 5 is as follows: a channel layer 41 (a channel layer made for example of a group III nitride semiconductor such as GaN, InGaN, and InAlGaN) is formed over an appropriate substrate (a substrate made for example of SiC, Sapphire, Si, and GaN, not illustrated), a buffer layer (a buffer layer made for example of a combination of a plurality of group III nitride semiconductors such as AlN, AlGaN, GaN, and InGaN, not illustrated), or the like. A carrier supply layer 58 including a semiconductor (a group III nitride semiconductor such as AlGaN and InAlGaN) having a wider band gap than the channel layer 41 is stacked over the channel layer 41.

The channel layer 41, however, has a projection and a recesses on and in its surface, and the carrier supply layer 58 planarizes the surface. A gate electrode 45 that forms a Schottky contact is formed on a portion of the carrier supply layer 58 over the projection on the channel layer 41. A source electrode 44a and a drain electrode 44b that form ohmic contacts with the carrier supply layer 58 are also formed. As long as the source electrode 44a and the drain electrode 44b are respectively on the left and right sides of the gate electrode 45, these electrodes may not be located on the carrier supply layer 58 as shown in FIG. 5. For example, these electrodes may have a recessed ohmic structure (an ohmic electrode structure manufactured by digging the carrier supply layer) in which these electrodes are formed to be in contact with both the carrier supply layer 58 and the channel layer 41.

The gate electrode 45 may not fall within a range corresponding to the width of the projection on the channel layer 41, as long as the gate electrode 45 at least overlaps the portion of the carrier supply layer 58 over the projection on the channel layer 41.

FIGS. 6A through 6F show a method for manufacturing the nitride semiconductor device in the present embodiment. FIGS. 6A through 6F show a minimum structure for achieving one aspect of the present invention, and the manufacturing method is in no way limited.

Figure 6A:
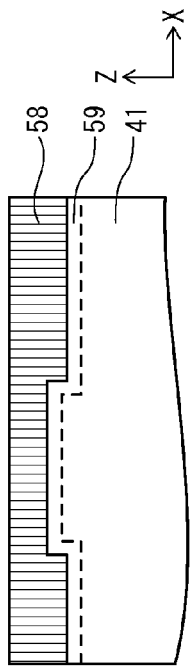
FIGS. 6A through 6F are schematic sectional views showing the structures in steps of manufacturing the group III nitride semiconductor HFET having the projection at the interface between the carrier supply layer and the channel layer.

At first, a buffer layer (a buffer layer made for example of a combination of a plurality of group III nitride semiconductors such as AlN, AlGaN, GaN, and InGaN, not illustrated) is grown over a substrate (not illustrated) for group III nitride semiconductor epitaxial growth made for example of Sapphire, SiC, Si, and GaN by using a known epitaxial growth method (e.g. metal organic chemical vapor deposition (MOCVD)) as appropriate. A channel layer 2041 (e.g. GaN and InGaN) including a group III nitride semiconductor is then grown. A resist pattern 54 is formed, by using known photolithography or a similar method, on a portion of the epitaxial growth substrate above which a gate electrode is to be formed (FIG. 6A). Recesses 60 are then formed by using known dry etching (e.g. RIE and ICP-RIE) using chlorine gas and boron chloride gas or a similar method.

Figure 6B:
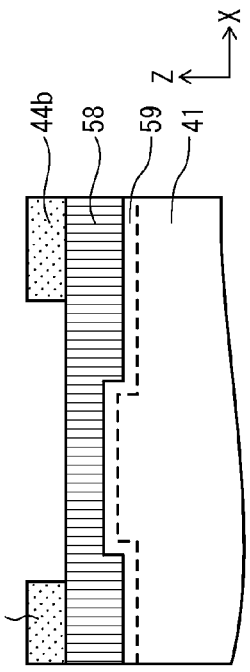
Figure 6C:
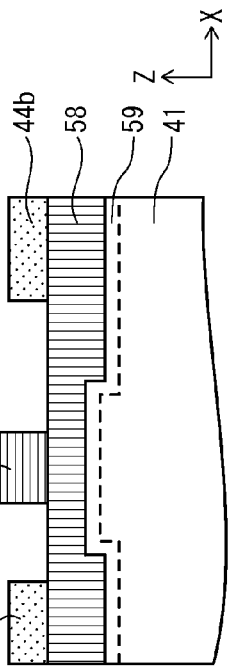
Figure 6D:
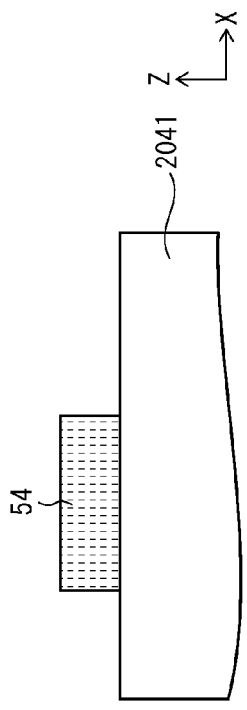

After purifying a surface of the substrate by using organic detergent, and the like (FIG. 6C), the carrier supply layer 58 is regrown so as to cover the recesses by using the known epitaxial growth method (FIG. 6D). The carrier supply layer 58 includes a group III nitride semiconductor having a wider band gap than the channel layer 41. The carrier supply layer 58 is not limited to a single layer. For example, the carrier supply layer 58 may have a heterostructure composed of a plurality of layers, such as the AlGaN/GaN structure (not illustrated) and the GaN/AlGaN structure (not illustrated).

It is desirable to regrow the carrier supply layer 58 on condition that the recess and the projection are non-uniformly covered and the surface of the carrier supply layer 58 is planarized.

As a result of the above-mentioned processing, a 2DEG layer 59 projecting upwards is formed at an interface between the carrier supply layer 58 and the channel layer 41.

Figure 6E:
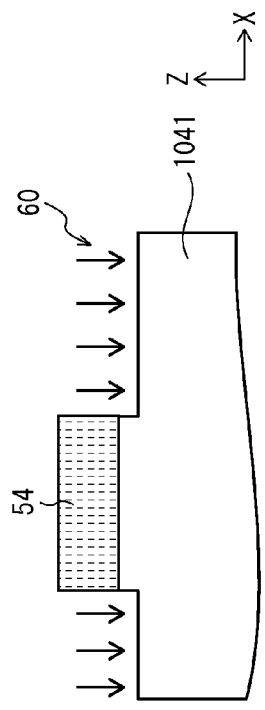
Figure 6F:
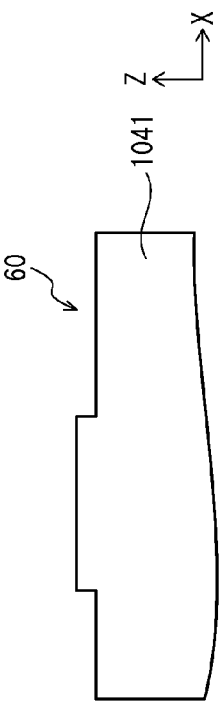

Electrodes (e.g. electrodes made of a combination of one or more layers of Ti, Al, Mo, and Hf) that form ohmic contacts are then formed on portions of the carrier supply layer 58 over the recesses 60 in the channel layer 41 by using known photolithography, deposition, lift-off, annealing, and the like. The source electrode 44a and the drain electrode 44b are herein respectively formed above the left side recess 60 and the right side recess 60 (FIG. 6E).

As long as these ohmic electrodes are above the recesses 60 in the channel layer 41, these ohmic electrodes may be in contact with a group III nitride semiconductor of any of the carrier supply layer 58 and the channel layer 41 (may have a so-called recessed ohmic structure).

Similarly, by using the known photolithography, deposition, lift-off, annealing, and the like, the gate electrode 45 is then formed on a portion of the carrier supply layer 58 not over the recesses 60 but over the projection (FIG. 6F), and the processing is completed. The gate electrode 45 is required to at least overlap the portion of the carrier supply layer 58 not over the recesses 60 but over the projection.

With the above-mentioned structure, the forward voltage $V_f$ and the threshold voltage $V_{th}$ are controlled almost exclusively by the carrier supply layer 58. Since the in-plane distributions of the forward voltage $V_f$ and the threshold voltage $V_{th}$ thus depend almost exclusively on the growth rate and the in-plane distribution of the carrier supply layer 58, the in-plane distribution greatly improves. In Embodiments 1 and 2, since the recesses are formed by dry etching portions of the channel layers 1, 21, and 41 under the gate electrodes 5 and 25, the source electrode 44a, and the drain electrode 44b, there are concerns that the channel surface might deteriorate by plasma damage and electrons might be trapped at the level. With the above-mentioned structure, however, plasma does not directly affect the portion under the gate where electric field concentration is most likely to occur, and thus the occurrence of the trap is minimized and the current collapse is suppressed.

Embodiment 3

Figure 7A:
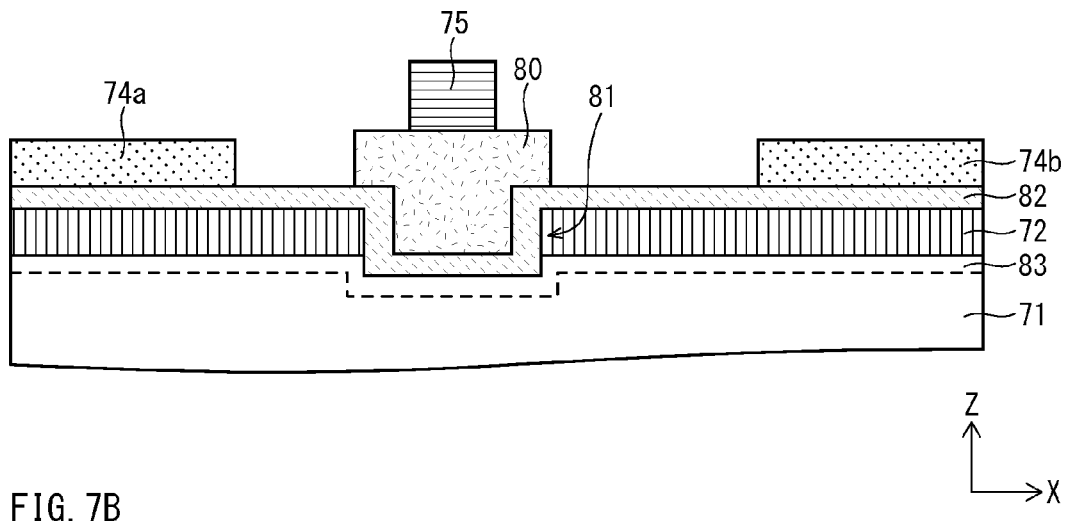
FIG. 7A is a schematic sectional view showing an example of the structure of a recessed group III nitride semiconductor HFET having a recess at an interface between a carrier supply layer and a channel layer and including a p-type group III nitride semiconductor layer under a gate electrode.
Figure 7B:
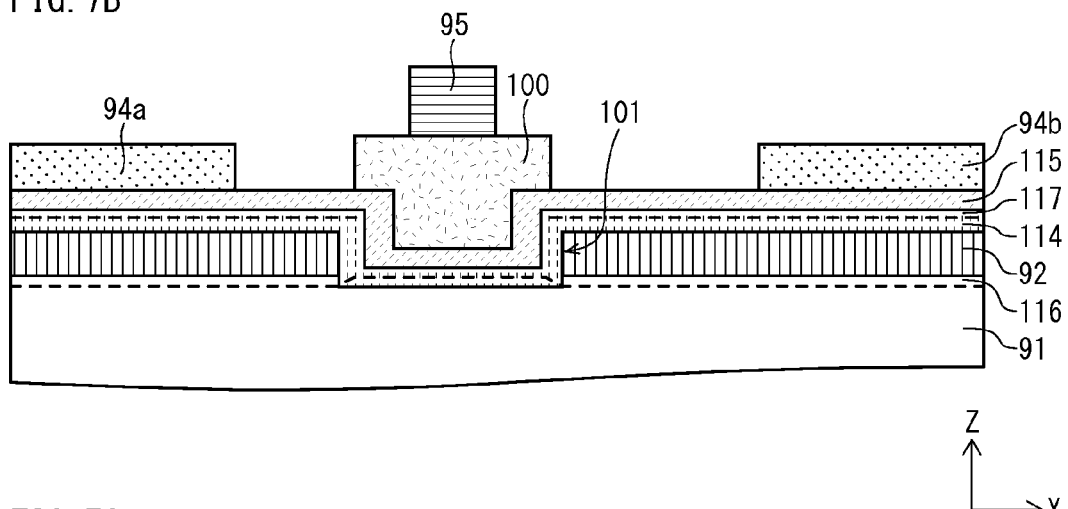
FIG. 7B is a schematic sectional view showing another example of the structure of the recessed group III nitride semiconductor HFET having the recess at the interface between the carrier supply layer and the channel layer and including the p-type group III nitride semiconductor layer under the gate electrode.
Figure 7C:
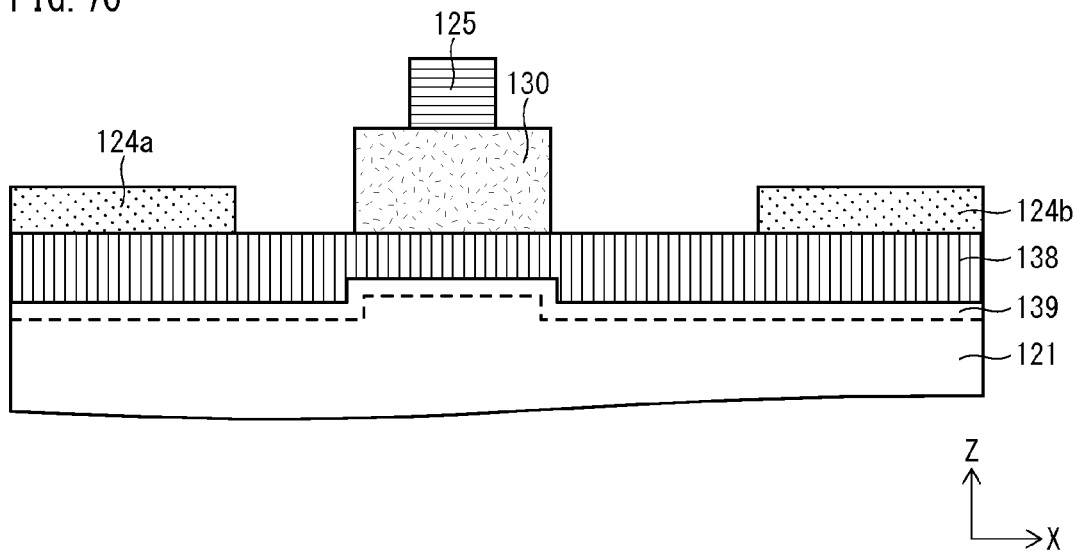
FIG. 7C is a schematic sectional view showing an example of the structure of a group III nitride semiconductor HFET having a projection at an interface between a carrier supply layer and a channel layer and including a p-type group III nitride semiconductor layer under a gate electrode, each pertaining to Embodiment 3 of the present invention.

FIGS. 7A through 7C each show the structure of a group III nitride semiconductor HFET having a recess or a projection at an interface between a carrier supply layer and a channel layer and including a p-type group III nitride semiconductor layer under a gate electrode, in Embodiment 3 of the present disclosure.

FIG. 7A shows the structure of a group III nitride semiconductor HFET corresponding to Embodiment 1 described above, and including a p-type group III nitride semiconductor layer (a p-type cap layer) 80 between a gate electrode 75 and a recess 81 (Example 1).

FIG. 7B shows the structure of a group III nitride semiconductor HFET corresponding to that shown in FIG. 3 in Embodiment 1 described above, and including a p-type group III nitride semiconductor layer (a p-type cap layer) 100 between a gate electrode 95 and a recess 101 (Example 2).

FIG. 7C shows the structure of a group III nitride semiconductor HFET corresponding to Embodiment 2 described above, and including a p-type group III nitride semiconductor layer (a p-type cap layer) 130 between a gate electrode 125 and a projection at an interface between a channel layer 121 and a carrier supply layer 138 (Example 3).

The p-type caps 80 and 100 in Examples 1 and 2 described above are respectively on portions of the second carrier supply layers 82 and 115 over the recesses 81 and 101, and at least partially overlap the respective portions over the recesses 81 and 101.

The p-type cap 130 in Example 3 described above is on a portion of the carrier supply layer 138 over the projection on the channel layer 121, and at least partially overlap the portion over the projection on the channel layer 121.

Figure 8A:
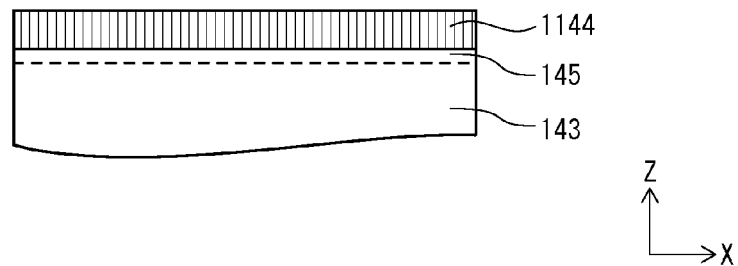
FIGS. 8A through 8D are schematic sectional views showing the structures in steps of manufacturing a group III nitride semiconductor HFET having a recess at an interface between a carrier supply layer and a channel layer and achieving normally-off operation.
Figure 8B:
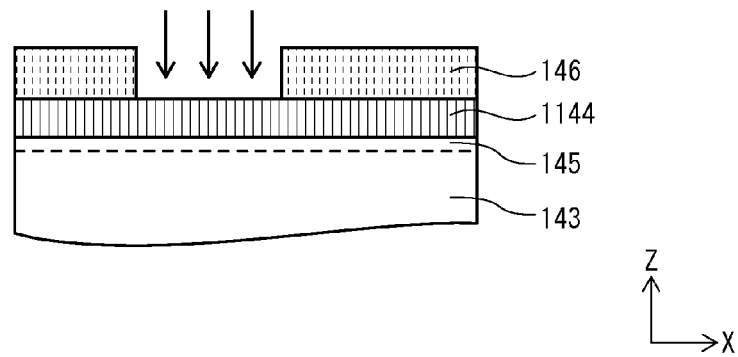
Figure 8C:
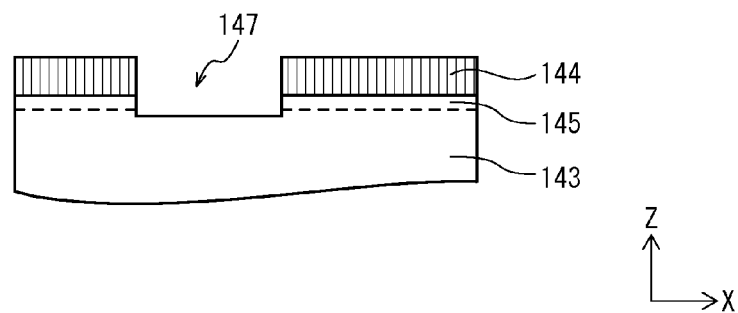

FIGS. 8A through 8D as well as 9A through 9D show a method for manufacturing the nitride semiconductor device in these examples by taking Example 1 as an example. FIGS. 8A through 8D as well as 9A through 9D show a minimum structure for achieving one aspect of the present invention, and the manufacturing method is in no way limited. Processing performed in steps shown in FIGS. 8A through 8C is the same as that performed in Embodiment 3 shown in the steps shown in FIGS. 4A through 4C. Description thereof is thus omitted.

Figure 8D:
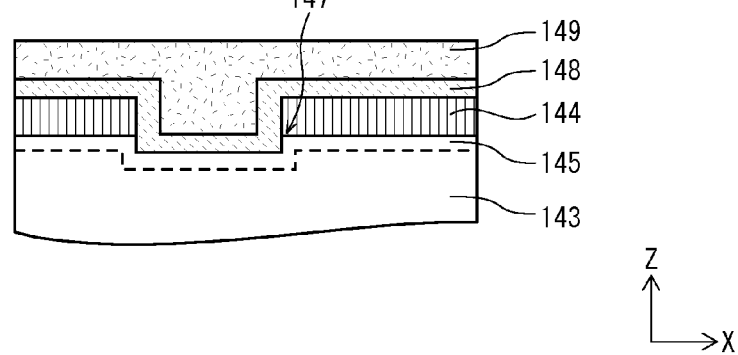

After purifying a surface of the substrate by using organic detergent, and the like, as shown in FIG. 8C, a second carrier supply layer 148 and a p-type group III nitride semiconductor layer 149 (e.g. p-AlGaN and p-GaN) are regrown so as to cover the recess 147 by using the known epitaxial growth method (FIG. 8D). The second carrier supply layer 148 includes a group III nitride semiconductor having a wider band gap than a channel layer 143. It is desirable to regrow the second carrier supply layer 148 on condition that the recess and the projection are uniformly covered.

The second carrier supply layer 148 is not limited to a single layer. For example, the second carrier supply layer 148 may have a heterostructure, such as the AlGaN/GaN structure (not illustrated) and the GaN/AlGaN structure (not illustrated).

The p-type group III nitride semiconductor layer 149 is also not limited to a single layer. For example, the p-type group III nitride semiconductor layer 149 may have a heterostructure composed of a plurality of layers, such as a p-AlGaN/p-GaN structure (not illustrated) and a p-GaN/p-AlGaN structure (not illustrated).

Figure 9A:
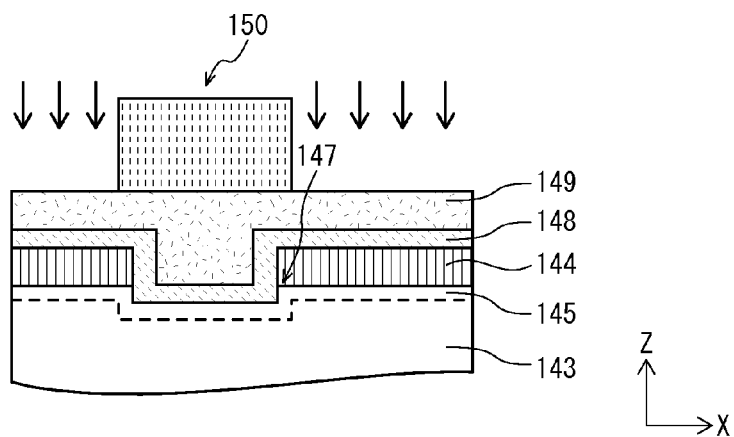
FIGS. 9A through 9D are schematic sectional views showing the structures in steps of manufacturing the group III nitride semiconductor HFET having the recess at the interface between the carrier supply layer and the channel layer and achieving the normally-off operation.

A resist pattern 150 is then formed by using known photolithography. Only a portion of the p-type group III nitride semiconductor layer 149 under the gate is left by using known selective dry etching (e.g. RIE and ICP-RIE) using chlorine gas and boron chloride gas or a similar method (FIG. 9A), thereby forming a p-type cap 151.

Figure 9B:
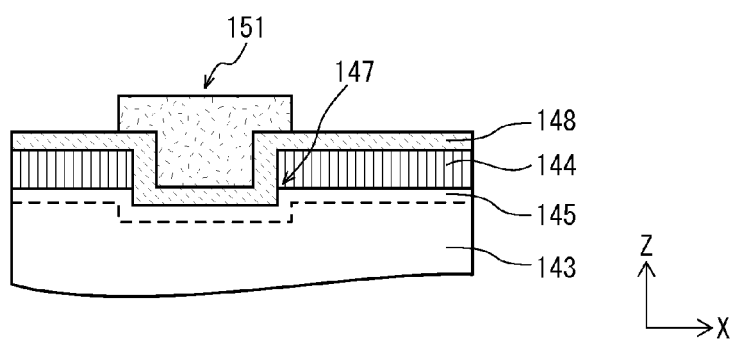

The resist pattern 150 is then removed by using organic detergent to purify the surface of the substrate (FIG. 9B).

The p-type cap 151 is located above the recess 147, and is at least partially in contact with the recess 147.

Figure 9C:
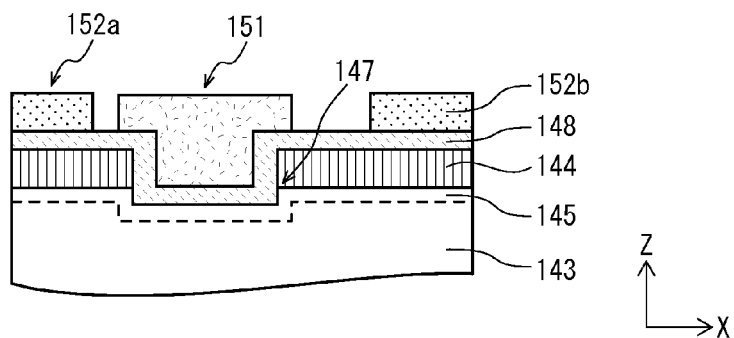

Electrodes (e.g. electrodes made of a combination of one or more layers of Ti, Al, Mo, and Hf) that form ohmic contacts are then formed on portions of the carrier supply layer 148 located on respective sides of the p-type cap 151 by using known photolithography, deposition, lift-off, annealing, and the like. A source electrode 152a and a drain electrode 152b are herein respectively formed on the left side and the right side of the p-type cap 151 (FIG. 9C).

As long as these ohmic electrodes are respectively on the left and right sides of the p-type cap 151, these ohmic electrodes may be in contact with a group III nitride semiconductor of any of the carrier supply layer 144, the second carrier supply layer 148, and the channel layer 143 (may have a so-called recessed ohmic structure).

Figure 9D:
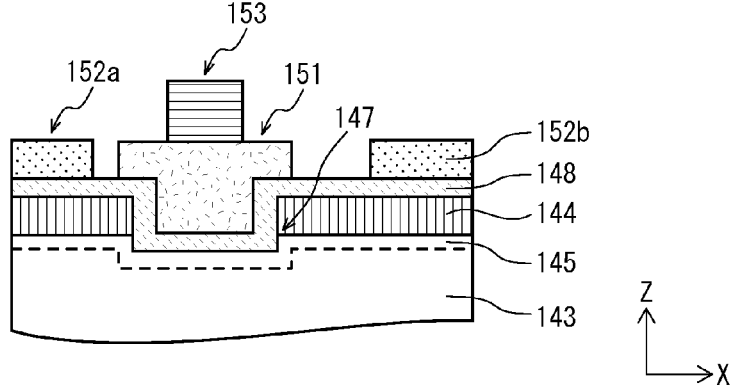

Similarly, by using the known photolithography, deposition, lift-off, annealing, and the like, a gate electrode 153 that forms an ohmic contact with the p-type cap 151 (e.g. an electrode made of a combination of one or more layers of Ni, Pt, Pd, and Au) or that forms a Schottky contact with the p-type cap 151 (e.g. an electrode made of a combination of one or more types of metal such as Ti, Al, Mo, and Hf) is then formed, and the processing is completed (FIG. 9D).

The gate electrode 153 is at least partially in contact with the p-type cap 151, and may not fall within a range corresponding to the width of the p-type cap 151.

With the above-mentioned structure, the forward voltage $V_f$ and the threshold voltage $V_{th}$ are controlled almost exclusively by the second carrier supply layer 148 and the p-type cap 151. Since the in-plane distributions of the forward voltage $V_f$ and the threshold voltage $V_{th}$ thus depend almost exclusively on the growth rate and the in-plane distribution of the carrier supply layer 148 and the p-type cap 151, the in-plane distribution greatly improves.

Figure 10:
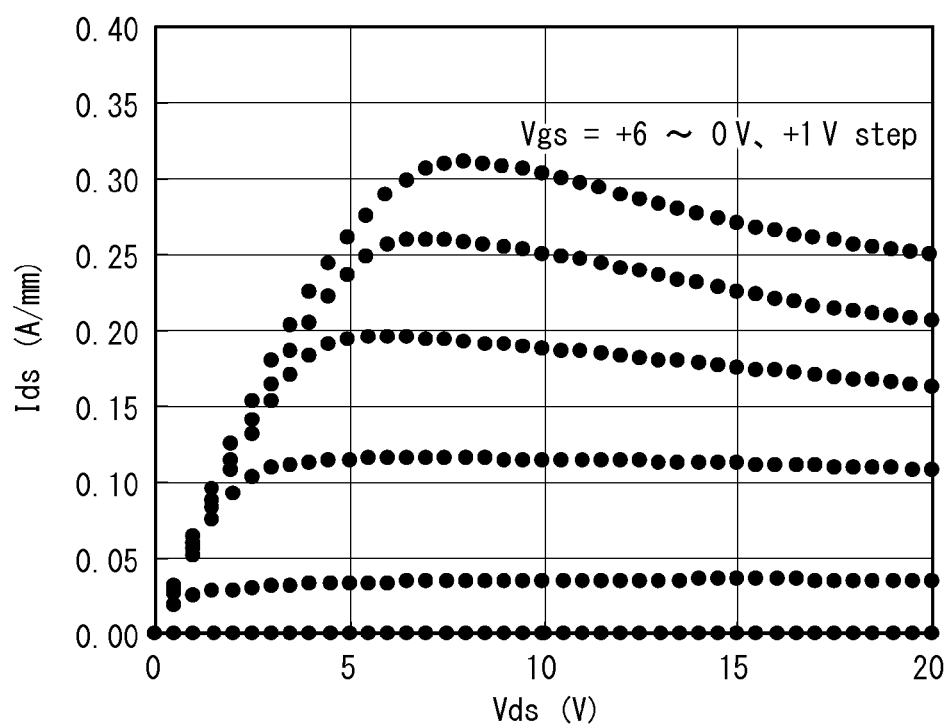
FIG. 10 is a schematic view showing Ids-Vds characteristics of the recessed group III nitride semiconductor HFET having the recess at the interface between the carrier supply layer and the channel layer and including the p-type group III nitride semiconductor layer under the gate electrode, as shown in FIG. 7A.

FIG. 10 shows Ids-Vds characteristics of the group III nitride semiconductor HFET having the structure shown in FIG. 7A pertaining to Example 1 described above.

As shown in FIG. 10, when the group III nitride semiconductor HFET has the structure pertaining to Example 1, problems such as a kink do not occur even if the channel curves, and thus favorable static characteristics (Ids-Vds characteristics) are be obtained.

Figure 14A:
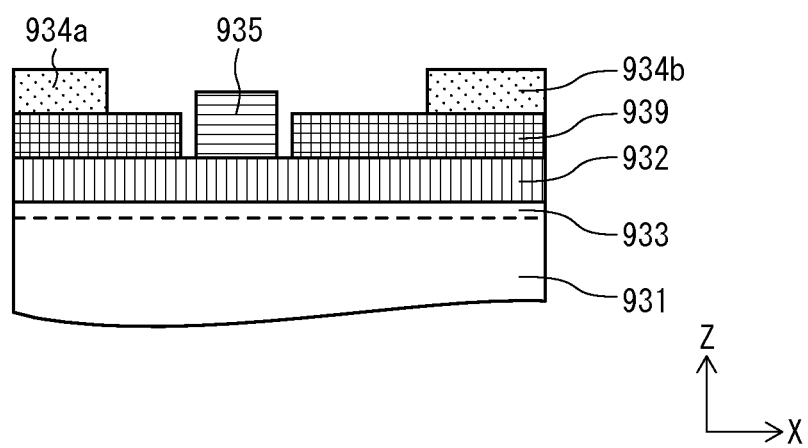
FIG. 14A is a schematic sectional view showing an example of the structure of a regrowth AlGaN/GaN-HFET pertaining to yet another conventional technique.
Figure 14B:
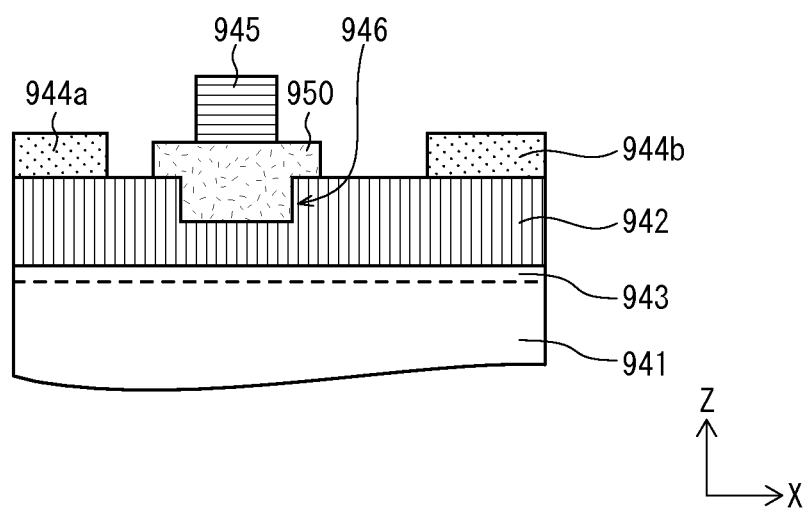
FIG. 14B is a schematic sectional view showing an example of the structure of a recessed gate AlGaN/GaN-HFET with a p-type cap layer pertaining to yet another conventional technique.

As can be seen in Table 2, a standard deviation σ (0.24 V) of the in-plane distribution (at 40 points in a plane of a wafer) of the threshold voltage $V_{th}$ of the group III nitride semiconductor HFET having the structure pertaining to one aspect of the present invention shown in Example 1 (FIG. 7A) is nearly half of that (0.42 V) of the group III nitride semiconductor HFET having the conventional structure (FIG. 14B).

A value (0.83 V) obtained by subtracting the minimum value from the maximum value of the threshold voltage $V_{th}$ at 40 points in the plane of the wafer improves in the structure pertaining to Example 1, compared to that (1.60 V) in the conventional structure.

TABLE 2

| $V_{th}$ | Conventional structure (FIG. 14B) | Structure of one aspect of the present invention (FIG. 7A) |
| --- | --- | --- |
| σ (V) | 0.42 | 0.24 |
| max − min(V) | 1.60 | 0.83 |

FIGS. 11A through 11D as well as 12A through 12D show a manufacturing method by taking Example 3 as an example. FIGS. 11A through 11D as well as 12A through 12D show a minimum structure for achieving one aspect of the present invention, and the manufacturing method is in no way limited.

Figure 11A:
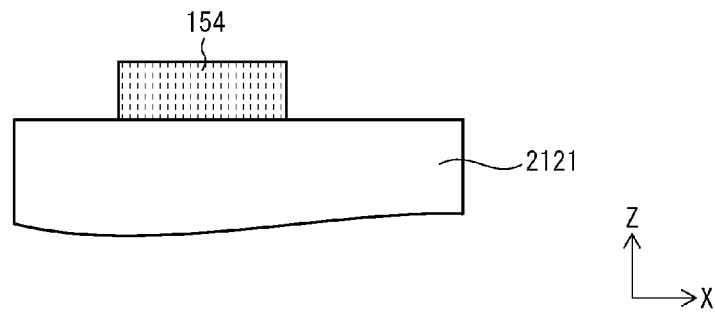
FIGS. 11A through 11D are schematic sectional views showing the structures in steps of manufacturing the group III nitride semiconductor HFET having the projection at the interface between the carrier supply layer and the channel layer.
Figure 11B:
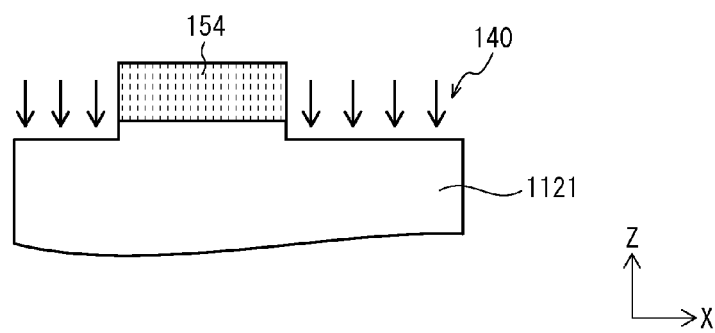
Figure 11C:
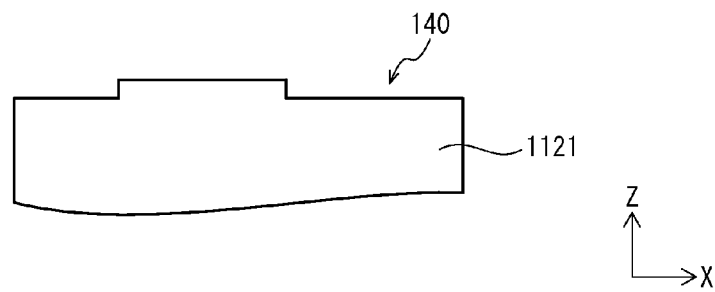

Processing performed in steps shown in FIGS. 11A through 11C is the same as that performed in Embodiment 3 shown in the steps shown in FIGS. 6A through 6C. Description thereof is thus omitted.

Figure 11D:
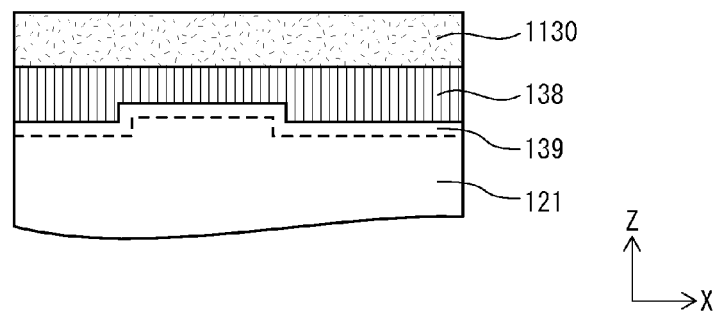

After purifying a surface of a substrate 1121 by using organic detergent, and the like, as shown in FIG. 11C, the carrier supply layer 138 and a p-type group III nitride semiconductor layer 1130 (e.g. p-AlGaN and p-GaN) are regrown so as to cover the recess by using the known epitaxial growth method (FIG. 11D). The carrier supply layer 138 includes a group III nitride semiconductor having a wider band gap than the channel layer 121. It is desirable to regrow the carrier supply layer 138 on condition that the recess and the projection are non-uniformly covered and the surface of the carrier supply layer 138 is planarized.

The carrier supply layer 138 is not limited to a single layer. For example, the carrier supply layer 138 may have a heterostructure composed of a plurality of layers, such as the AlGaN/GaN structure (not illustrated) and the GaN/AlGaN structure (not illustrated).

As a result of the above-mentioned processing, a 2DEG layer 139 projecting upwards is formed at an interface between the carrier supply layer 138 and the channel layer 121. The p-type group III nitride semiconductor layer 1130 is also not limited to a single layer. For example, the p-type group III nitride semiconductor layer 1130 may have a heterostructure composed of a plurality of layers, such as a p-AlGaN/p-GaN structure (not illustrated) and a p-GaN/p-AlGaN structure (not illustrated).

As a result of the above-mentioned processing, a 2DEG layer 139 projecting upwards is formed at an interface between the carrier supply layer 138 and the channel layer 121 (strictly speaking, no carrier exists in a part of the projection at the interface between the carrier supply layer 138 and the channel layer 121 due to the effect of a depletion layer formed by the p-type group III nitride semiconductor layer 1130).

Figure 12A:
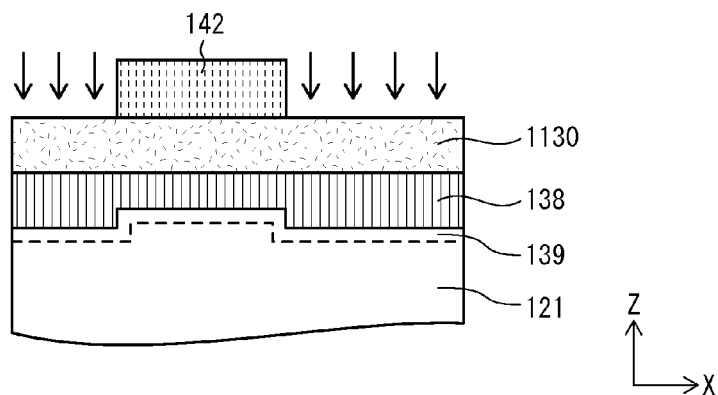
FIGS. 12A through 12D are schematic sectional views showing the structures in steps of manufacturing the group III nitride semiconductor HFET having the projection at the interface between the carrier supply layer and the channel layer.
Figure 12B:
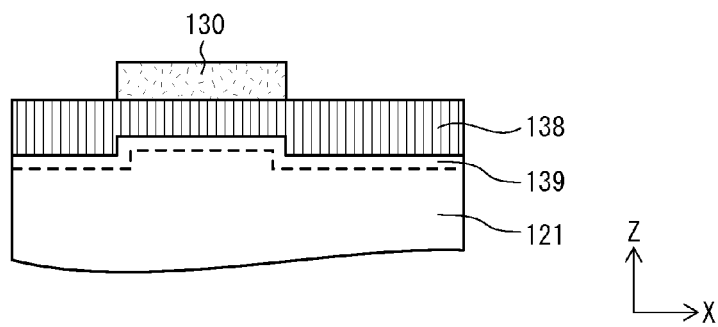

A resist pattern 142 is then formed by using known photolithography. Only a portion of the p-type group III nitride semiconductor layer 1130 under and around the gate is left by using known selective dry etching (e.g. RIE and ICP-RIE) using chlorine gas and boron chloride gas or a similar method (FIG. 12A), thereby forming a p-type cap 130 (FIG. 12B). The resist pattern 142 is then removed by using organic detergent to purify the surface of the substrate.

Figure 12C:
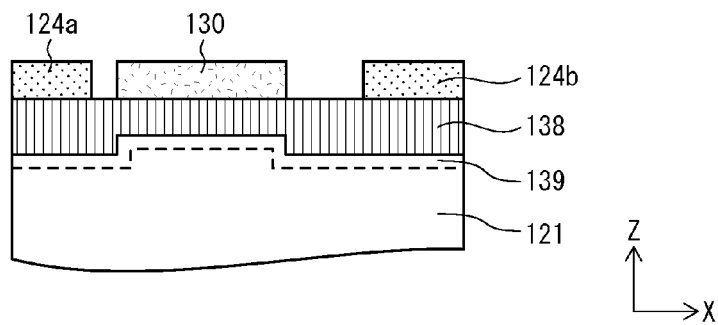
Figure 12D:
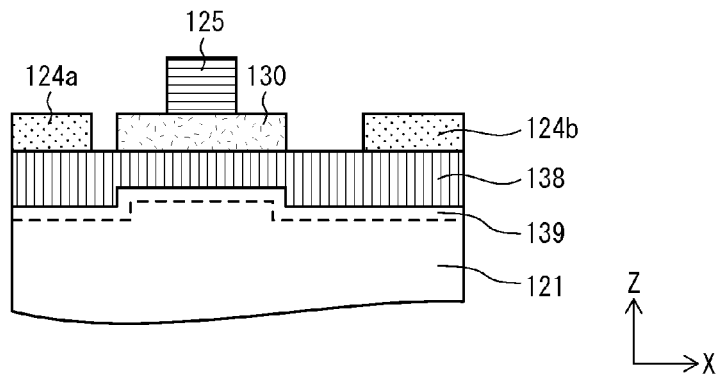
Figure 13A:
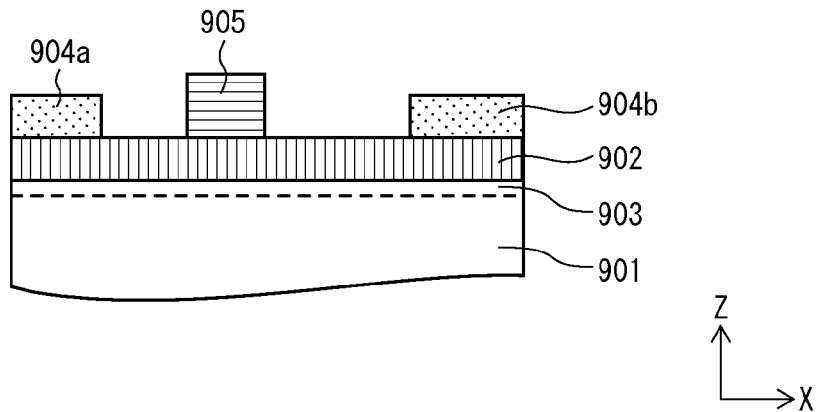
FIG. 13A is a schematic sectional view showing an example of the structure of an AlGaN/GaN-HFET pertaining to a conventional technique.
Figure 13B:
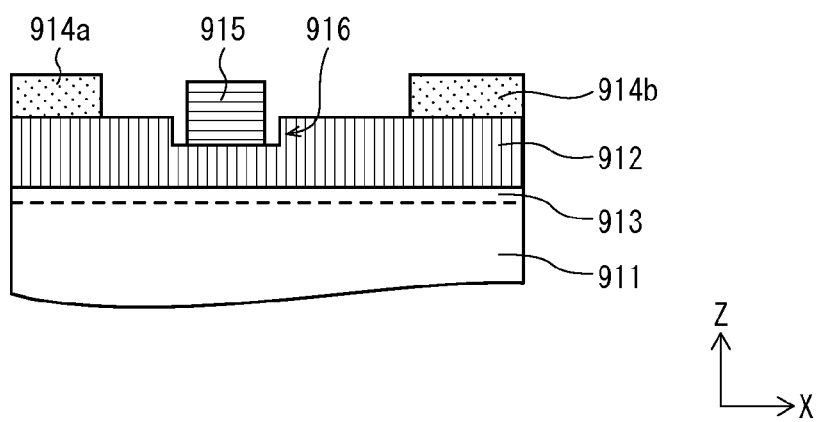
FIG. 13B is a schematic sectional view showing an example of the structure of a recessed gate AlGaN/GaN-HFET pertaining to another conventional technique.
Figure 13C:
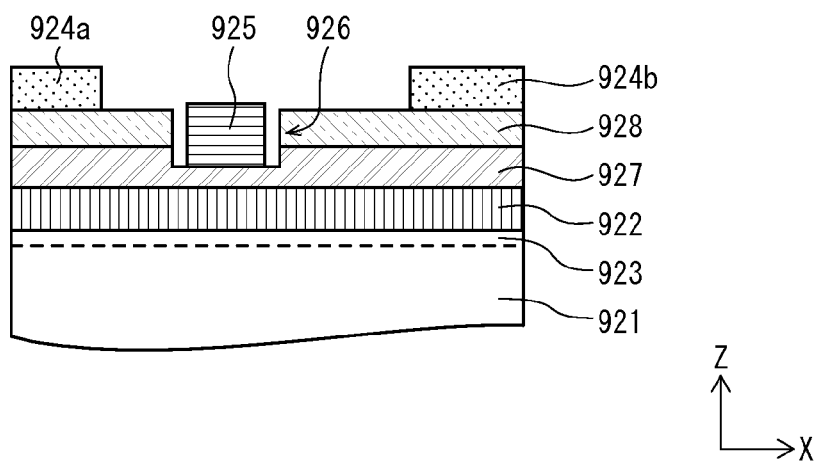
FIG. 13C is a schematic sectional view showing an example of the structure of a recessed gate AlGaN/GaN-HFET with an etching stopper layer.

Electrodes (e.g. electrodes made of a combination of one or more layers of Ti, Al, Mo, and Hf) that form ohmic contacts are then formed on portions of the carrier supply layer 138 over recesses 140 (see FIG. 11C) in the channel layer 121 by using known photolithography, deposition, lift-off, annealing, and the like. A source electrode 124a and a drain electrode 124b are herein respectively formed above the left side recess 140 and the right side recess 140 (FIG. 12C).

The p-type cap 130 is on a portion of the carrier supply layer 138 over the projection on the channel layer 121, and at least partially overlaps the portion of the carrier supply layer 138 over the projection on the channel layer 121.

As long as these ohmic electrodes are respectively on the left and right sides of the projection at the interface between the carrier supply layer 138 and the channel layer 121, these ohmic electrodes may be in contact with a group III nitride semiconductor of any of the carrier supply layer 138 and the channel layer 121.

Similarly, by using the known photolithography, deposition, lift-off, annealing, and the like, a gate electrode 125 that forms an ohmic contact with the p-type group III nitride semiconductor (e.g. an electrode made of a combination of one or more layers of Ni, Pt, Pd, and Au) or that forms a Schottky contact with the p-type group III nitride semiconductor (e.g. an electrode made of a combination of one or more types of metal such as Ti, Al, Mo, and Hf) is then formed on the p-type cap 130 above the projection, and the processing is completed.

The gate electrode 125 may not fall within a range corresponding to the width of the projection on the channel layer 121, as long as the gate electrode 125 at least overlaps a portion of the p-type cap 130 on the portion of the carrier supply layer 138 over the projection on the channel layer 121.

With the above-mentioned structure, the forward voltage $V_f$ and the threshold voltage $V_{th}$ are controlled almost exclusively by the carrier supply layer 138 and the p-type cap 130. Since the in-plane distributions of the forward voltage $V_f$ and the threshold voltage $V_{th}$ thus depend almost exclusively on the growth rate and the in-plane distribution of the carrier supply layer 138 and the p-type cap 130, the in-plane distribution greatly improves.

INDUSTRIAL APPLICABILITY

The present invention is useful for implementing the nitride semiconductor device that excels in the in-plane distribution and the controllability of the threshold value of the group III nitride semiconductor for achieving the normally-off operation and that provides increased safety.

REFERENCE SIGNS LIST 1, 21, 41, 71, 91, 121, 901, 911, 921, 931, 941, 1001, 1021, 1041, 1121, 2041, 2121 channel layer
2, 22, 58, 72, 92, 138, 902, 912, 922, 932, 942, 1002, 1022, 1144 carrier supply layer
4a, 24a, 44a, 74a, 94a, 124a, 904a, 914a, 924a, 934a, 944a source electrode
4b, 24b, 44b, 74b, 94b, 124b, 904b, 914b, 924b, 934b, 944b drain electrode
5, 25, 45, 75, 95, 125, 905, 915, 925, 935, 945 gate electrode
11, 31, 81, 101, 916, 926, 946 recess
12, 35, 82, 115 second carrier supply layer
13, 23, 36, 59, 83, 116, 139, 903, 913, 923, 933, 943, 1013, 1023 2DEG
14, 54, 142, 150, 154, 164 resist pattern
34, 114 second channel layer
37, 117 second 2DEG
60, 140 recess
80, 100, 130, 950 p-type cap
1130 p-type group III nitride semiconductor layer

The invention claimed is:
1. A nitride semiconductor device comprising:
a substrate;
a semiconductor layer stack that is located over the substrate, and includes:
 a first nitride semiconductor layer having a recess, the recess not extending completely through the first nitride semiconductor layer,
 a second nitride semiconductor layer located over a portion of the first nitride semiconductor layer other than the recess, and having a larger band gap than the first nitride semiconductor layer, and
 a third nitride semiconductor layer, configured as a carrier supply layer, continuously covering the second nitride semiconductor layer and the recess of the first nitride semiconductor layer, and having a larger band gap than the first nitride semiconductor layer;
a gate electrode that is located on and in direct contact with the third nitride semiconductor layer, above the recess; and
a source electrode and a drain electrode that are located on the semiconductor layer stack on opposite sides of the recess when viewed in plan, wherein a portion of the first nitride semiconductor layer forming a bottom of the recess of the first nitride semiconductor layer is in direct contact with the third nitride semiconductor layer, and
when voltage is applied between the gate electrode and the source electrode, current flows from the drain electrode to the source electrode.

2. A nitride semiconductor device comprising:
a substrate;
a semiconductor layer stack that is located over the substrate, and includes:
   a first nitride semiconductor layer having a projection at an upper surface thereof, and
   a second nitride semiconductor layer covering the upper surface of the first nitride semiconductor layer, in direct contact with an upper surface of the projection, having a larger band gap than the first nitride semiconductor layer, and having a planar upper surface;
a gate electrode in direct contact with an upper surface of the second nitride semiconductor layer over the projection; and
a source electrode and a drain electrode that are located above the second nitride semiconductor layer distant from the projection on opposite sides of the gate electrode when viewed in plan.

3. A nitride semiconductor device comprising:
a substrate;
a semiconductor layer stack that is located over the substrate, and includes:
   a first nitride semiconductor layer having a projection at an upper surface thereof,
   a second nitride semiconductor layer covering the upper surface of the first nitride semiconductor layer, in direct contact with an upper surface of the projection, having a larger band gap than the first nitride semiconductor layer, and having a planar upper surface, and
   a p-type third nitride semiconductor layer in direct contact with an upper surface of the second nitride semiconductor layer above the projection;
a gate electrode that is located on the third nitride semiconductor layer; and
a source electrode and a drain electrode that are located above the second nitride semiconductor layer on opposite sides of the gate electrode and not superimposed over the projection when viewed in plan.

4. A nitride semiconductor device comprising:
a substrate;
a semiconductor layer stack that is located over the substrate, and includes:
   a first nitride semiconductor layer having a recess, the recess not extending completely through the first nitride semiconductor layer,
   a second nitride semiconductor layer located over a portion of the first nitride semiconductor layer other than the recess, and having a larger band gap than the first nitride semiconductor layer, and
   a third nitride semiconductor layer, configured as a carrier supply layer, continuously covering the second nitride semiconductor layer and the recess of the first nitride semiconductor layer, and having a larger band gap than the first nitride semiconductor layer;
a p-type fourth nitride semiconductor layer that is located above the recess, on and in direct contact with a portion of the third nitride semiconductor layer whose surface is recessed in accordance with an underlying structure thereof, the fourth nitride semiconductor layer having a planar surface by filling the recessed surface of the third nitride semiconductor layer, partially covering an uppermost surface of the third nitride semiconductor layer, and having a T-shaped cross-section;
a gate electrode that is located on the fourth nitride semiconductor layer; and
a source electrode and a drain electrode that are located on the semiconductor layer stack on opposite sides of the fourth nitride semiconductor layer when viewed in plan, wherein
a portion of the first nitride semiconductor layer forming a bottom of the recess of the first nitride semiconductor layer is in direct contact with the third nitride semiconductor layer, and
when voltage is applied between the gate electrode and the source electrode, current flows from the drain electrode to the source electrode.

5. The nitride semiconductor device according to claim 4, wherein, when viewed in plan, both ends of the fourth nitride semiconductor layer are each closer to a different one of the source electrode and the drain electrode than both ends of the recess.

6. The nitride semiconductor device according to claim 4, further comprising:
   a first two-dimensional electron gas layer that is located at and around an interface of the first nitride semiconductor layer with the second nitride semiconductor layer; and
   a second two-dimensional electron gas layer that is located at and around an interface of the first nitride semiconductor layer with the third nitride semiconductor layer, wherein
   when viewed in cross-section, the first two-dimensional electron gas layer and the second two-dimensional electron gas layer are continuously curved downwards in a convex shape.

7. The nitride semiconductor device according to claim 4, wherein
the third nitride semiconductor layer includes a plurality of nitride semiconductor sublayers,
the plurality of nitride semiconductor sublayers include:
   a fifth nitride semiconductor sublayer as an undermost layer; and
   a sixth nitride semiconductor sublayer that is located on the fifth nitride semiconductor sublayer and has a larger band gap than the fifth nitride semiconductor sublayer.

8. The nitride semiconductor device according to claim 7, further comprising:
   a third two-dimensional electron gas layer that is located at and around an interface of the first nitride semiconductor layer with the second nitride semiconductor layer; and
   a fourth two-dimensional electron gas layer that is located at and around an interface of the fifth nitride semiconductor sublayer with the sixth nitride semiconductor sublayer in the recess,
   wherein when viewed in cross-section, the third two-dimensional electron gas layer and the fourth two-dimensional electron gas layer are continuously curved upwards in a convex shape.

9. The nitride semiconductor device according to claim 7, further comprising:
   in the portion of the first nitride semiconductor layer other than the recess, a two-dimensional electron gas layer having a two-layer structure including:

a fifth two-dimensional electron gas sublayer that is located at and around an interface of the fifth nitride semiconductor sublayer with the sixth nitride semiconductor sublayer; and
a third two-dimensional electron gas sublayer that is located at and around an interface of the first nitride semiconductor layer with the second nitride semiconductor layer.

10. The nitride semiconductor device according to claim 7, wherein the fifth nitride semiconductor sublayer has the same band gap as the first nitride semiconductor layer.

11. The nitride semiconductor device according to claim 7, wherein the fifth nitride semiconductor sublayer has a larger band gap than the first nitride semiconductor layer.

* * * * *